United States Patent Office 3,369,207
Patented Feb. 13, 1968

3,369,207
TEMPERATURE VARIED SEMICONDUCTOR DEVICE

Kichisabro Hasegawa, Meguru-ku, Tokyo, Etsuyuki Matsuura, Shinagawa-ku, Tokyo, and Motoaki Matsuura, Minato-ku, Tokyo, Japan, assignors to Hasegawa Electronics Co., Ltd., Tokyo, Japan, a corporation of Japan Filed Jan. 16, 1964, Ser. No. 338,160
Claims priority, application Japan, Mar. 8, 1963, 38/12,094; Mar. 27, 1963, 38/15,600; May 14, 1963, 38/25,165; June 11, 1963, 38/31,327, 38/31,328; June 29, 1963, 38/33,943
7 Claims. (Cl. 338—23)

ABSTRACT OF THE DISCLOSURE

The natural voltage-current characteristic of a semiconductor element of silicon or germanium is modified by artifically changing its natural temperature. The semiconductor element can be artifically heated by application of heat thereto from an electrical heating coil wrapped around the element; a heat dissipating plate can be applied to the element in heat-transfer relation; and the element may be artifically cooled by utilizing a thermoelement in spaced relation with the element or by immersing the element in a cold liquid such as liquid nitrogen.

The semiconductor element with its natural voltage-current characteristic so modified is inserted into an electrical circuit to serve as a current or voltage regulator.

This invention relates to temperature varied semiconductor devices, and more particularly, to constant voltage and constant current elements and other electric devices in which are used such semiconductor elements as of silicon and germanium.

Various devices have been already suggested for constant voltage and constant current devices. However, each of them has a defect that the formation of the device itself is complicated and expensive. The present invention is to provide a constant voltage and constant current element in which the above mentioned defect is eliminated.

A principal object of the present invention is to provide a semiconductor element having constant voltage and constant current characteristics.

Another object of the present invention is to provide a constant voltage and constant current circuit in which is utilized a semiconductor element.

The present invention is to provide a semiconductor element whose voltage-current characteristics are varied by a heating, heat-radiating or cooling action given to it.

A crystal of silicon or germanium is cut to be in the form of a bar. A lead wire is connected to each end of the bar. The lead wire and the bar are so formed as to have an ohmic contact. If an electric current is made to flow by controlling the voltage to the ends of both lead wires, when the voltage is low, the voltage-current curve will linearly rise. That is to say, the higher the voltage, the larger the current. In such case, due to the Joule heat, the lattice temperature of the semiconductor element will rise to be higher than the room temperature.

When the semiconductor to be used in the present invention is of silicon, it may be used at a carrier concentration of $10^{19}$ to $10^{15}$ at the room temperature.

Around the room temperature, the Fermi level of silicon will be substantially in the middle between the forbidden band in semiconductor. In such case, a carrier concentration substantially equal to the number of impurity atoms (which will be electrons in the case of the n-type but will be positive holes in the case of the p-type) will be present in the silicon and the electric conductivity will be able to be represented by the Formula 1. However, it is thought that there may be a little of the p-type even in the n-type well controlled around the room temperature. Therefore, $$\sigma=\frac{1}{\rho}=ne\mu_e+pe\mu_p \qquad (1)$$

wherein $\sigma$=Electric conductivity
$\rho$=Specific electric resistance
$n$=Concentration of electrons
$e$=Charge of electrons
$p$=Concentration of holes
$\mu_e$=Mobility of electrons
$\mu_p$=Mobility of holes.

The Formula 1 will be established in case a very low voltage is applied when a low voltage is applied and the electric conductivity is measured while gradually elevating the temperature from below the room temperature, it will be found that, from the room temperature up to about 250° C., the electric conductivity will fall but, in the intrinsic range, it will rise again. The falling part is because the carrier is subjected to lattice dispersion.

Figure 1:
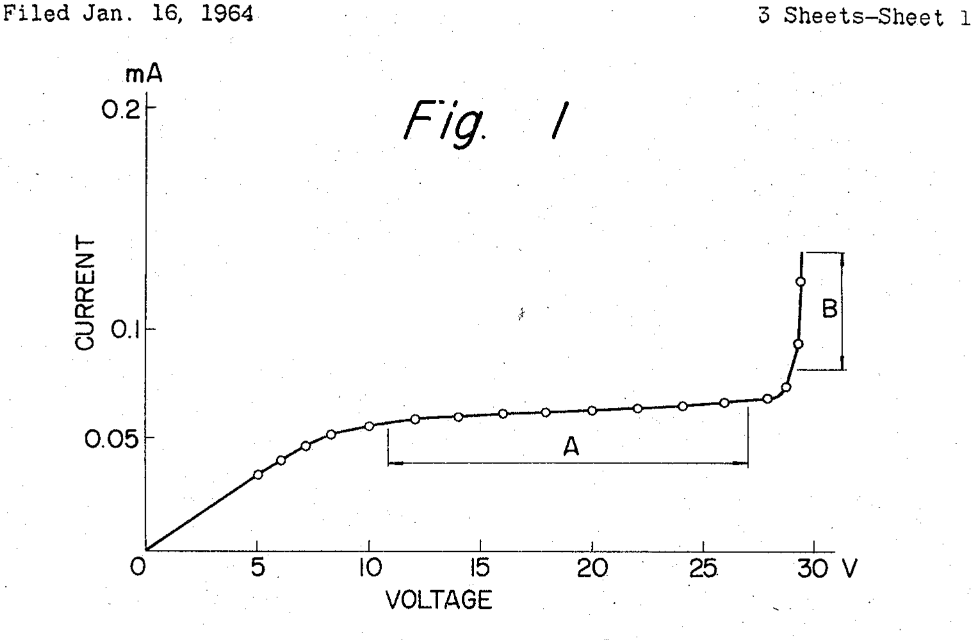
FIGURE 1 shows a voltage-current curve when an electric current is made to flow by controlling the voltage through silicon having an electric resistance value of 0.5 Ω cm. at 20° C.

In the present invention, from the Formula 1, if a high voltage is controlled and applied, such characteristics as are shown in FIGURE 1 will be shown. First of all, a quick current increase is shown in the constant voltage range because, due to the Joule heat of silicon, the current carrier will show a quick increase, will collide with the lattice as a so-called intrinsic semiconductor and will promote the lattice vibration which will further excite a new carrier and will increase the current carriers.

The constant current range A occurs in a range of a voltage lower than the constant voltage range B presumably because, when the voltage is gradually increased, above the room temperature, if silicon is used, the lattice vibration caused by the energy increase of the carrier by the increase of the voltage will decrease the mobility of the carrier but, as the lattice vibration brings the Fermi level closer to the middle between the conductor of silicon and the forbidden band, the carrier concentration will be directed toward increase and this balance will become an element of the constant current and, on the other hand, the heat radiation on the surface of silicon and the performance of the current carrier are in a very complicated relation with each other.

In the voltage-current characteristics of a directly heating thermister used today, in case the voltage value is small, the current value will be small, the characteristics will substantially follow Ohm's law and the voltage-current will be linear. The present invention is essentially different from the conventional thermister in respect that, in such case, in the present invention, the voltage-current characteristics will not be linear but will have a constant current range, because the width of the forbidden band of the conventional thermister is very large but the width of the forbidden band of silicon according to the present invention is smaller than that.

Further, in the conventional thermister, there are shown such characteristics that, when the current is increased to some extent, the self-heating will increase so much that the temperature of the thermister itself will rise to deviate from Ohm's law and, with the increase of the current, the voltage will rather decrease but, when the current is further increased, the voltage will increase.

The present invention is to keep a constant voltage range by using an intrinsic range of silicon.

The element according to the present invention is so designed that its shape and surface may keep the amount of heat dispersion constant. That is to say, as the heat conduction and the loss of heat radiated from the surface are proportional to the absolute temperature $T^4$, the temperature at which silicon comes to be in an intrinsic range or constant voltage range will be around 300 to 250° C. and, below that temperature, the silicon will remain in a constant current range. Therefore, the condition that heat genertaion by the voltage and heat dispersion are balanced with each other by the shape is taken at 50 to 250° C.

As the semiconductor element of silicon according to the present invention is operated with a temperature difference of 100 to 200° C. from the room temperature, the operating temperature will be very stable even though the temperature of the atmosphere fluctuates. Further, the conventional alternating current constant voltage stabilizing device and direct current constant voltage stabilizing device utilizing vacuum tubes are so costly and complicated as to require a high degree of technology, whereas very stable and cheap direct current and alternating current constant voltage stabilizing devices are obtained by utilizing silicon elements according to the present invention.

Figure 2:
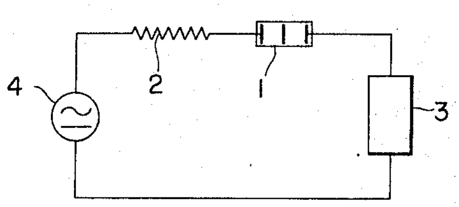
FIGURE 2 shows a constant current and constant voltage circuit in which is used a semiconductor element.

FIGURE 2 illustrates a constant voltage and constant current device utilizing a semiconductor element of the present invention. In the drawing, 1 is such semiconductor constant voltage and current element as of silicon or germanium. Said semiconductor constant voltage and current element 1, a protective resistance 2 and a load 3 are connected in series to an electric source 4. In such case, the current flowing through the circuit will become a constant current due to the action of the constant voltage and current semiconductor element and the voltage of the load will become constant due to Ohm's law.

The constant voltage and current element of the semiconductor used in the above mentioned circuit is formed by welding a lead wire substantially to each end part of such semiconductor element as of silicon or germanium. Not only the above mentioned semiconductor but also such intermetallic semiconductor in the Group III–V as, for example, Ga=Sb may be used in the constant current range in which the increase of the electric conducting carrier in the electric heating operation and the mobility of the carrier are balanced with each other by heat dispersion.

According to the present invention, as described above, the voltage or current of an alternating current or direct current circuit can be made constant by merely inserting a constant voltage and constant current element of a semiconductor into the circuit. The formation is very simple. Even a small element can be used in a circuit of a large current. Therefore, the industrial effect of the present invention is high in respect that the circuit is simpler and the price is lower than with the conventional Zener diode element or the like.

Further, the moment a metallic filament is switched, such large current as to shorten the life of the filament will flow through it. However, by automatically controlling the current with a silicon element according to the present invention, the life of vacuum tubes and cathode ray tubes can be kept very long. There has been no such simple, small and cheap controlling element.

As it is possible to control a large current and high voltage by increasing the size and number of the elements, they can be used for such large devices as large voltage stabilizers for factories as well as such small devices as measuring instrument circuits and television voltage stabilizers for homes.

The voltage-current characteristics can be varied by heating the above mentioned semiconductor element from outside. An embodiment thereof shall be given in the following.

Figure 3:
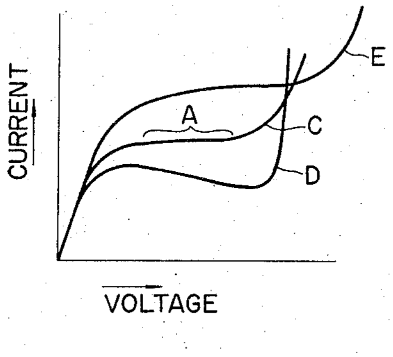
FIGURE 3 is a diagram for explaining the characteristics of a semiconductor.
Figure 4:
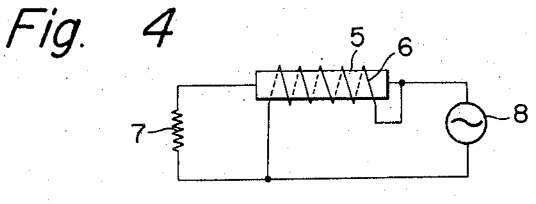
FIGURE 4 shows a circuit of a semiconductor element to which is applied a heating coil.

When a voltage is applied to both ends of a semiconductor element made by fixing a lead wire to each end of such semiconductor as of silicon or germanium and the current flowing through said semiconductor element is measured, such current-voltage curve as is represented by the curve C in FIGURE 3 will be obtained. On this curve, the part A represents a constant current range. The above mentioned property is a characteristic of the semiconductor itself. A heating coil is provided on this element. The element thus provided with the heating coil is kept in air or in a vacuum. In FIGURE 4, 5 is the above mentioned semiconductor element, 6 is the heating coil wrapped around said semiconductor element, 7 is a load and 8 is an electric source. When a current is made to flow through said heating coil to heat the semiconductor element, such characteristics as are represented by the curve D in FIGURE 3 will be shown and the current will decrease with the rise of the voltage.

The reason therefore is considered to be as follows. In the case of the curve C, the electrons flowing through the crystal lattice will give the lattice an energy accelerated by the electric field. However, it is considered that, as the mobility of the electrons is reduced by the heat generated by the mutual action of the electrons and lattice, the current will not rise quickly even due to the rise of the voltage. When the heating coil is added to the semiconductor element, the motion of the electrons will be controlled by the lattice temperature by heating and the current will fall with the voltage rise as shown by the curve D.

The range of various applications of such devices as is described above is very wide.

Figure 5:
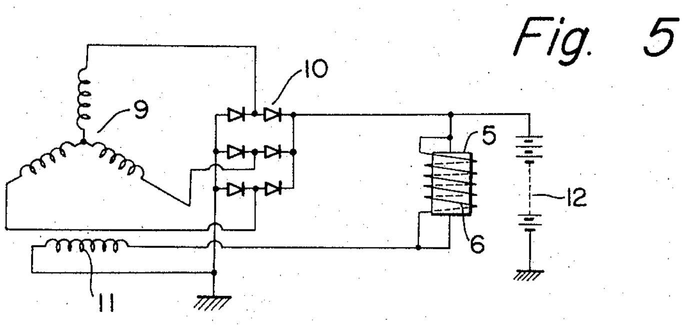
FIGURE 5 shows an example of application.

FIGURE 5 shows an example of application of the present invention. In the drawing, 5 is a semiconductor element, 6 is a heating coil, 9 is an armature coil of an alternating current generator, 10 is a rectifier, 11 is a field coil and 12 is a storage battery. If the above mentioned circuit formation is taken, when the terminal voltage of the generator rises due to any cause, the current flowing through the field coil will decrease and therefore, as a result, the generator voltage will be able to be perfectly controlled.

As described above, the present invention is to provide a heating coil on a semiconductor element so that, when heat is applied to the semiconductor element, the current will be able to be decreased with the rise of the voltage. Therefore, a voltage and current element of a very wide range of application can be obtained.

Figure 6:
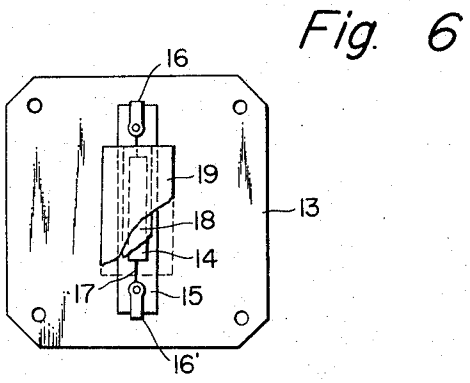
FIGURE 6 is a plan view of a semiconductor element to which is applied a thermal conducting plate.
Figure 7:
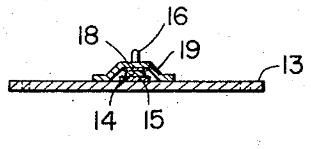
FIGURE 7 is an elevation of the same.

Further, if a heat dispersion device is applied to the semiconductor element, the voltage-current characteristics will be able to be varied. An embodiment shall be explained with reference to FIGURE 6. In FIGURE 6, 13 is a heat radiating plate made of a metal in the form of a plate, 14 is such semiconductor element as of silicon or germanium and 15 is such insulating plate as, for example, of mica. Terminals 16 and 16' are secured respectively to both ends of said mica plate, 17 is a lead wire connecting the semiconductor element 14 with the terminals 16 and 16'. 18 is an insulating plate mounted on the semiconductor element 14 and made, for example, of mica. 19 is an inverted U-shaped pressing plate acting to secure the semiconductor element 14 to the heat radiating plate 13 through the insulating plate 18.

When the voltage-current charcteristics of a constant voltage and constant current element of silicon having no heat conducting device in air are investigated, such characteristics as are represented by the curve C in FIGURE 3 will be shown. As the constant voltage and constant current semiconductor element in the constant current range is considered to keep a state of balance of the electric energy and heat dispersion energy, when natural heat conduction is made by adding a device to the above mentioned constant voltage and constant current semiconductor element so as to make proper heat conduction, such characteristics as are represented by the curve E in FIGURE 3 will be shown.

When natural or forced heat conduction is made by adding such heat conducting device, the voltage range in the constant current range will expand, the amount of the current will increase and the stability of the characteristics will improve. Further, in the case of obtaining a fixed amount of the current, the element itself can be designed to be smaller than in the case of adding no heat conducting device. If one end of any electric device is utilized as a heat conducting device, the element will be able to be made smaller than in the case of floating it in air. Specifically, the heat conducting device can be added so as to properly select the position in which the current will quickly increase at the constant amount of the current, in the voltage range and at the constant voltage in addition to the inherent properties of the semiconductor element.

When a thermoelement is added to the semiconductor element of the present invention, the voltage-current characteristics will be able to be further improved. An embodiment thereof shall be explained with reference to FIGURES 8 and 9.

As there is heat generation by an internal current depending on the current flowing through the semiconductor element, when the voltage is raised, the temperature of the constant current range will rise due to self-heat generation or Joule heat but the mobility of the carriers (electrons or holes) will fall with the rise of the temperature. This is considered to be a constant current range. If the temperature of such constant current and constant voltage range is automatically controlled in response to the fluctuation of the current and voltage, a semiconductor element of a larger current and higher voltage will be able to be obtained more stably. The present invention is to freely provide a constant current and constant voltage element of a large capacity by using a thermoelement as combined in response to the above mentioned semiconductor element.

Figure 8:
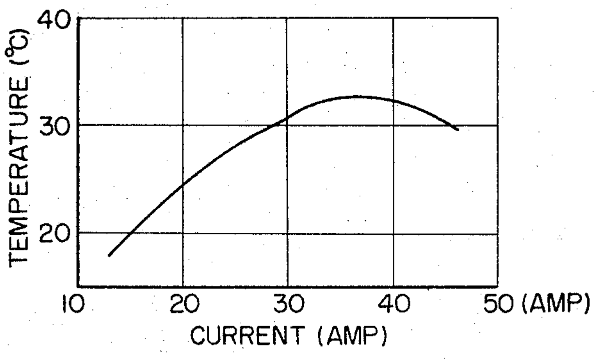
FIGURE 8 is a characteristics diagram of a thermoelement.

FIGURE 8 shows the characteristics of such thermoelement. In the diagram, the cooling temperature is taken on the ordinate and the current is taken on the abscissa. As illustrated, the element is so designed that the temperature may fall with the increase of the current.

Figure 9:
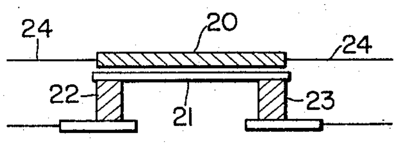
FIGURE 9 shows a semiconductor element to which is applied a thermoelement.

In FIGURE 9, 20 is the above mentioned constant current and constant voltage element, 21 is a thermoelement, 22 and 23 are legs of said thermoelement and 24 is a lead wire. In the present invention, the semiconductor element 20 and the thermoelement 21 are arranged as opposed to each other so that the constant current and constant voltage semiconductor element 20 may be cooled by the thermoelement 21.

In the constant current range of the part A in FIGURE 1, the amount of heat generation will increase with the rise of the voltage. The constant current range can be expanded by cooling the thus increased portion by controlling the thermoelement. Further, in the constant voltage range of the part B in FIGURE 1, by adding the thermoelement to the semiconductor element, the rise of the characteristics curve can be made steep and an ideal constant voltage range can be obtained.

If the semiconductor element of the present invention is placed in a low temperature liquid, the voltage-current curve will be able to be further varied.

Figures 10, 11:
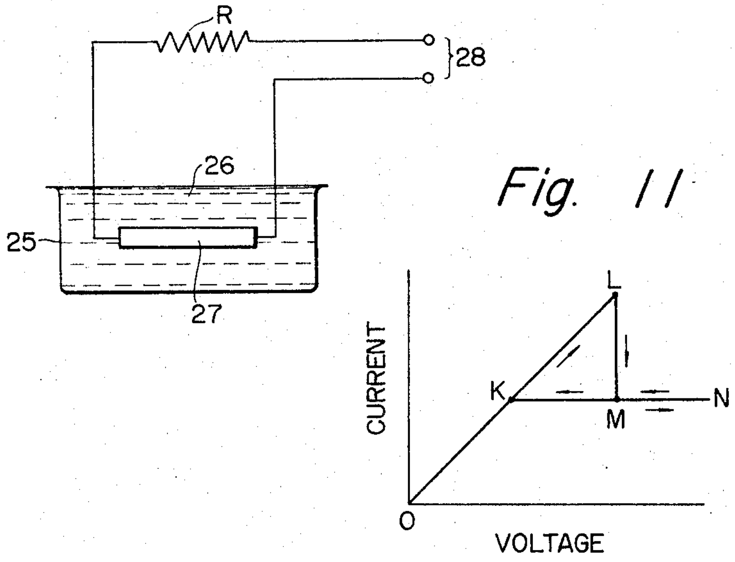
FIGURE 10 shows a semiconductor element immersed in liquid nitrogen.
FIGURE 11 shows voltage-current characteristics of the semiconductor element shown in FIGURE 10.

That is to say, when the semiconductor is immersed and held in liquid nitrogen and is connected to an alternating current or direct current source and the voltage is varied, a constant and long irreversible current variation wll be caused. In FIGURE 10, such liquid nitrogen 26 is contained in a container 25 and such semiconductor 27 as of germanium or silicon is held in the liquid by any proper means.

Said conductor 27 is connected to an alternating current or direct current source 28 so as to be fed with an electric current from the source and a proper load R and voltage regulator are interposed between the current source and semiconductor. If the semiconductor 27 is thus fed with an electric current, as shown in FIGURE 11, when the voltage V is increased, first the current-voltage curve will linearly rise according to Ohm's law and, when the voltage is further increased and a constant voltage, for example, the point L is reached depending on the length and cross-sectional area of the semiconductor 27, the current will quickly decrease within a short time and will stop at the point M. When the voltage is further increased at this stopping point M, the amount of the current will be constant for the rise of the voltage and the phenomenon of M—N will be produced.

On the contrary, when the voltage is reduced, the amount of the current at the point M will become constant. When the voltage is further reduced past the point M, if the current is advanced to the points M and L, it will proceed to the point K. Even if the voltage is kept constant at each of the points M and K for any time, the current will not vary.

The above mentioned phenomenon is seen in both n-type and p-type of the semiconductor 27, is not a simple performance of electrons or positive holes and is a phenomenon combined with a surface heat phenomenon and appearing as the dependence of the electric resistance of the semiconductor on the temperature variation. When the Hall coefficient and conductivity are measured by the four-point method, the Hall coefficient will be substantially constant during the entire operation but the mobility will reduce very much at the points L and N.

The constancy of the current at the voltages of the points K, M, L and K, M, N will be kept for such a long time and the stability between the points M and N will be so high that, if the semiconductor is used as an element for such memorizing apparatus as electric calculating machines by utilizing this performance, it will be most effective and will be able to remarkably simplify the entire formation. It can be applied also to a switch mechanism in a specific case.

What is claimed is:

1. A semiconductor element for electrical circuit control purposes comprising a bar of silicon having a current carrier concentration of from $10^{19}$ to $10^{15}$ cc. at 300° K., terminal means provided at the opposite ends of said bar for connection of the bar into an electrical circuit to be controlled, and means for modifying the environmental temperature of said bar thereby to effect a corresponding modification of the normal ranges of its constant current and constant voltage characteristics.

2. A semiconductor element as defined in claim 1 wherein the silicon bar is of the n-type.

3. A semiconductor element as defined in claim 1 wherein the silicon bar is of the p-type.

4. A semiconductor element as defined in claim 1 wherein said means for modifying the environmental temperature of said bar is constituted by an electrically energized heater coil surrounding said bar and transferring heat thereto.

5. A semiconductor element as defined in claim 1 wherein said means for modifying the environmental temperature of said silicon bar is constituted by a heat radiating plate secured to said silicon bar in heat transfer relation therewith.

6. A semiconductor element as defined in claim 1 wherein said means for modifying the environmental temperature of said silicon bar is constituted by a thermoelement extending lengthwise of said silicon bar and spaced therefrom, said thermoelement serving to lower the temperature of said silicon bar by extracting heat therefrom.

7. A semiconductor element as defined in claim 1 wherein said means for modifying the environmental temperature of said silicon bar is constituted by a bath of low-temperature liquid in which said silicon bar is immersed.

References Cited

UNITED STATES PATENTS

| | | | |
|---|---|---|---|
| 2,386,903 | 10/1945 | Lutomirski | 338—23 |
| 2,860,219 | 11/1958 | Taft et al. | 338—22 |
| 2,871,330 | 1/1959 | Collins | 338—22 |
| 2,871,427 | 1/1959 | Tyler et al. | 338—22 |
| 2,947,844 | 8/1960 | Howling | 338—23 |

RICHARD M. WOOD, *Primary Examiner.*

W. BROOKS, *Assistant Examiner.*